United States Patent [19]
Rosier et al.

[11] Patent Number: 5,216,804
[45] Date of Patent: Jun. 8, 1993

[54] METHOD AND DEVICE FOR PLACING A COMPONENT ON A PRINTED CIRCUIT BOARD

[75] Inventors: Willem J. Rosier; Antonius C. M. Gieles, both of Eindhoven, Netherlands

[73] Assignee: U.S. Philips Corp., New York, N.Y.

[21] Appl. No.: 771,387

[22] Filed: Oct. 3, 1991

[30] Foreign Application Priority Data

May 21, 1991 [EP] European Pat. Off. ........ 91201206.9

[51] Int. Cl.⁵ .......................... H05K 3/30; B23P 19/00
[52] U.S. Cl. ........................ 29/834; 29/740; 29/832
[58] Field of Search ............ 29/740, 741, 832, 759, 29/834; 414/730; 901/40

[56] References Cited

U.S. PATENT DOCUMENTS

| | | | |
|---|---|---|---|
| 4,553,843 | 11/1985 | Langley et al. | 356/375 |
| 4,644,642 | 2/1987 | Wardenaar et al. | 29/740 X |
| 4,675,993 | 6/1987 | Harada | 29/740 |
| 4,980,971 | 1/1991 | Bartschat et al. | 29/740 X |
| 5,058,263 | 10/1991 | Corbeij et al. | 29/740 |
| 5,079,834 | 1/1992 | Itagaki et al. | 29/740 X |
| 5,084,959 | 2/1992 | Ande et al. | 29/740 |
| 5,084,962 | 2/1992 | Takahashi et al. | 29/740 X |
| 5,177,864 | 1/1993 | Oyama | 29/741 X |

FOREIGN PATENT DOCUMENTS

| | | |
|---|---|---|
| 0092292 | 10/1983 | European Pat. Off. |
| 0350850 | 1/1990 | European Pat. Off. |
| 0432848 | 6/1991 | European Pat. Off. |
| 0434156 | 6/1991 | European Pat. Off. |
| 3546216 | 7/1986 | Fed. Rep. of Germany |
| 85-02088 | 5/1985 | World Int. Prop. O. ............ 29/832 |

OTHER PUBLICATIONS

IBM Tech. Disclosure Bull vol. 26 No. 7B Dec. 1983, pp. 3664–3666 by V. DiLorenzo et al.

*Primary Examiner*—Carl J. Arbes
*Attorney, Agent, or Firm*—Ernestine C. Bartlett

[57] ABSTRACT

A method of placing a component on a printed circuit board by means of a manipulator and a device suitable for carrying out this method, whereby the position of the component is determined with an imaging device. The imaging device makes a picture of the component and of a reference member coupled to the manipulator. The position of the component relative to the manipulator can be directly determined from this picture. The positions of the manipulator and the component relative to the imaging device may also be determined. Using the so determined component position, the component is placed on a printed circuit board in a given orientation so that the component leads are inserted into mating holes in the printed circuit board.

12 Claims, 4 Drawing Sheets

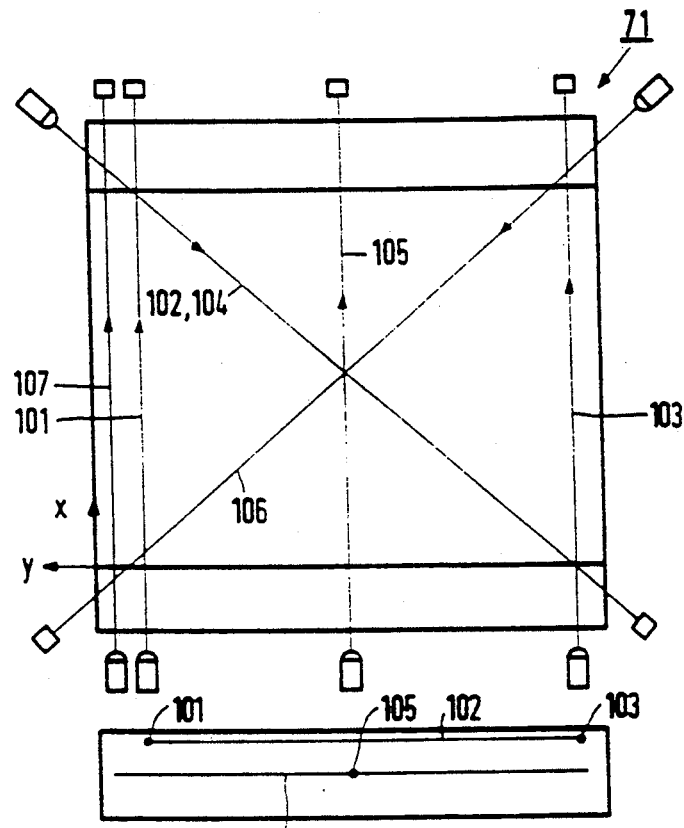
FIG.6B
FIG.6C
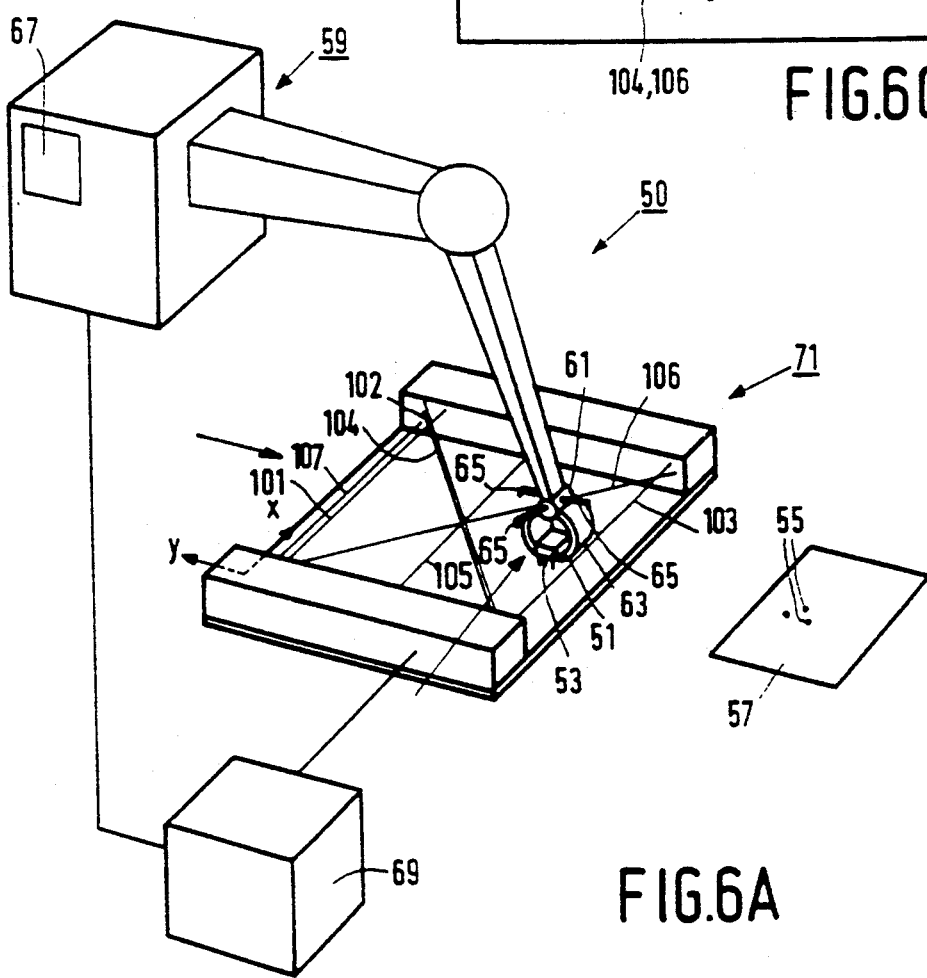
FIG.6A

METHOD AND DEVICE FOR PLACING A COMPONENT ON A PRINTED CIRCUIT BOARD

FIELD OF THE INVENTION

Of interest is commonly owned copending application Ser. No. 576,321 entitled "Manipulation Device", filed Aug. 29, 1990, now U.S. Pat. No. 5,058,263 issued Oct. 22, 1991.

The invention relates to methods of placing a component on a printed circuit board whereby a manipulator carrying the component is displaced relative to an imaging device and the component is brought into an image field of the imaging device, after which the position of the component is determined by means of the imaging device and subsequently the component is put in the correct position on the printed circuit board by the manipulator. The invention also relates to a device provided with an imaging device and at least one manipulator displaceable relative to the imaging device.

BACKGROUND OF THE INVENTION

A method of the kind mentioned in the opening paragraph and a device for carrying out said method are known from German Patent A1 3546216. In this known method, an electronic component (chip) is transported to a feed position by a supply device. In this feed position, a manipulator controlled by a control system picks up the component by means of an underpressure and moves it into an image field of an imaging device. A picture of the component is then taken by means of the imaging device. In an image signal processor, this picture is compared with a model picture of the component stored in this processor, and deviations in an x- and a y-direction and an angular deviation about a z-axis are computed. An x-axis and a y-axis, which define the x- and y-directions, lie in a plane parallel to the printed circuit board on which the component is to be placed. The z-axis is directed transversely to this plane and coincides with an axis of rotation of the manipulator. After the deviations have been computed, the component is rotated through an angle by the manipulator and is put in the desired position on the printed circuit board, during which the computed deviations are taken into account. During imaging of the component it is necessary for the manipulator to be in a position relative to the imaging device which is known beforehand. The position of the manipulator is determined by the control system. If the manipulator moves at a certain speed relative to the imaging device during imaging, the exact position of the manipulator at the imaging moment cannot be accurately determined by means of the control system. A disadvantage of this method and of this device is that, if the manipulator position relative to the imaging device deviates from the expected position, the position of the component relative to the imaging device cannot be well determined, and faulty corrections will be carried out. For example, if the component is picked up eccentrically by the manipulator, a rotation about the z-axis will cause deviations in the x- and y-directions. If the position of the manipulator relative to the imaging device is known, these deviations can be corrected during placement on the printed circuit board. If this position is not accurately known, these deviations cannot be corrected.

SUMMARY OF THE INVENTION

The invention has for its the provision of a method by which the positions of the component and of the manipulator can be accurately determined in such a way that a correct placement on the printed circuit board is possible.

The method according to the invention is for this purpose characterized in that a picture of the component and of a reference member coupled to the manipulator is made by means of the imaging device, after which the positions of the component and the manipulator relative to the imaging device are determined from this picture. These positions are compared with expected positions relative to the imaging device. Subsequently, the manipulator is moved to above the printed circuit board, during which the deviations are taken into account, and then the component is placed on the printed circuit board in the desired position.

The invention also has for its object the provision of a method by which the position of the component relative to the manipulator can be accurately determined in such a way that a correct placement on the printed circuit board is possible.

The method according to the invention is for this purpose characterized in that a picture of the component and of a reference member coupled to the manipulator is made by means of the imaging device, after which the position of the component relative to the manipulator is determined from this picture. This relative position is compared with an expected relative position, and deviations in the x- and y-direction and an angular deviation about the z-axis are computed therefrom. The manipulator is then moved to the desired position above the printed circuit board, during which the deviations are taken into account, and then the component is placed on the printed circuit board in the desired position. The position of the manipulator relative to the imaging device must be such that the component and the reference member are in the image field of the imaging device during imaging. The exact position of the imaging device is immaterial in this method.

It is noted that European Patent A2-0350850 discloses a method and a device where a camera is connected to a manipulator and makes a picture of the component and of a background which moves along with the camera and is provided with marks. In this device, the position of the manipulator relative to the camera is unequivocally known and the problem of determining the component position relative to the manipulator instead of the component position relative to the camera plays no part. A disadvantage of this device is that the camera moves along whenever the manipulator is displaced. The weight of the camera causes positioning inaccuracies during quick movements. Another disadvantage is that the use of a number of manipulators implies that each manipulator must be provided with a separate camera, so that a very expensive device is obtained.

An embodiment of the method according to the invention is characterized in that a picture is made by the imaging device while the component carried by the manipulator and the reference member coupled to the manipulator are being moved through the image field of the imaging device. This increases the speed at which the component is placed on the printed circuit board. The manipulator may be moved through the image field of the imaging device at any speed desired.

The invention also has for its object the provision of a device by which the disadvantage of the known device is obviated. The device suitable for carrying out the method according to the invention is for this purpose characterized in that the device is provided with a reference member which is coupled to the manipulator. This reference member has a fixed position relative to the manipulator. As a result, the position of the manipulator is known if the position of the reference member has been determined by the imaging device. The position of the component relative to the reference member can also be determined, upon which the position of the component relative to the manipulator is known.

An embodiment of the device according to the invention is characterized in that the device is provided with a number of manipulators, while the reference member is a common reference member which is coupled to all manipulators. The use of a number of manipulators increases the speed at which components can be placed on a printed circuit board. The use of a common reference member for all manipulators has the advantage that all manipulators can be coupled to a reference member in a simple manner.

Another embodiment of the device according to the invention is characterized in that the reference member comprises a plate which is provided with at least one mark. The mark may be a white square which is provided on a black plate so as to obtain a good contrast. An inexpensive reference member is obtained in this way which may be added in a simple way to an existing component placement device, such as, for example, the one described in the German Patent A1 3546216.

A further embodiment of the device according to the invention is characterized in that the reference member comprises a number of legs. Such a reference member is suitable in a device which is also provided with an imaging device which comprises at least one light source and a light sensor cooperating with said light source and which is suitable for placing components having connection wires. The legs of the reference member coupled to the manipulator and the connection wires of the component interrupt a light beam emitted by the light source in the direction of the light sensor at different moments. The position of the component relative to the manipulator can be determined from these moments. Such an imaging device is known from U.S. Pat. No. 4,553,843.

BRIEF DESCRIPTION OF THE DRAWINGS

The invention will be explained in more detail with reference to the drawing in which FIGS. 6b and 6c are a plan view and a lateral elevation, respectively, of an imaging device belonging to the device shown in FIG. 6a.

DETAILED DESCRIPTION OF PREFERRED EMBODIMENTS

Figure 1:
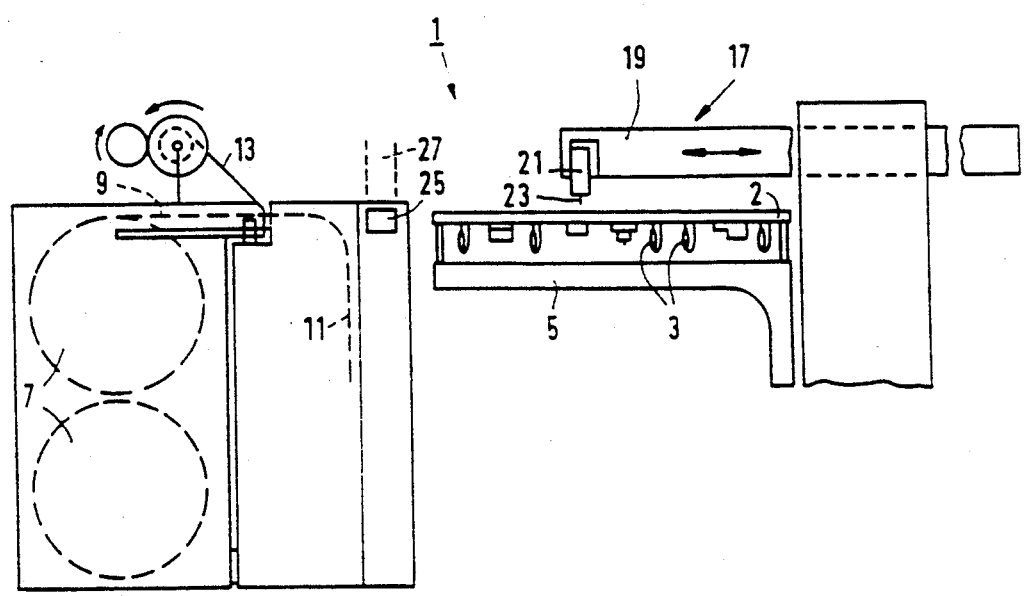
FIG. 1 is a diagrammatic side elevation of a device according to the invention.

The same reference numerals are used for the corresponding parts in the various Figures.

Figure 2:
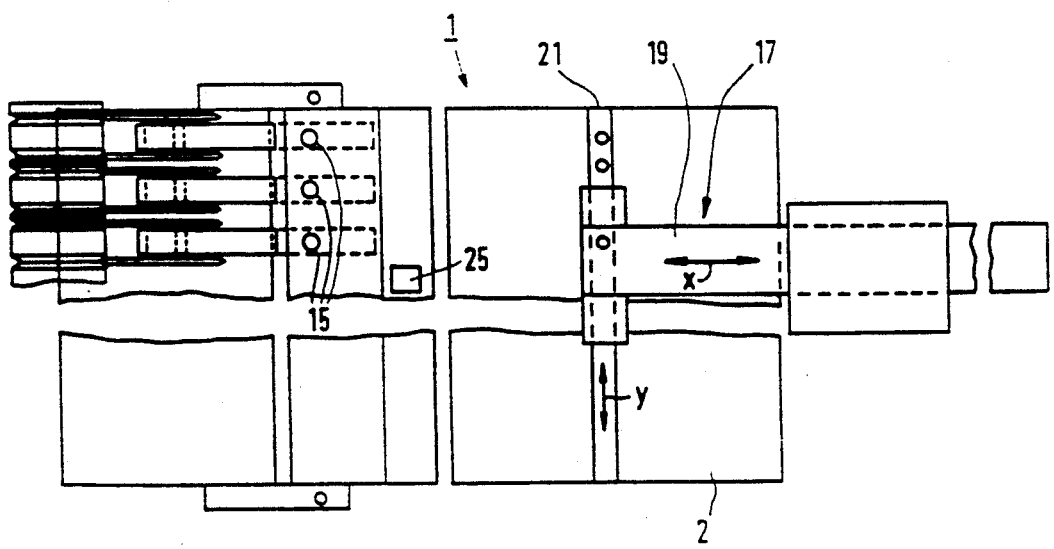
FIG. 2 is a diagrammatic plan view of the device.

FIGS. 1 and 2 show a device 1 for placing components on a printed circuit board in lateral elevation and in plan view, respectively. The reference numeral 2 in these Figures indicates a printed circuit board which has already been provided with components 3 at the lower side, which components have been placed in holes in the printed circuit board 2 with their connection wires. The printed circuit board 2 is supported by a carrier 5. Components are yet to be placed on the upper side of the printed circuit board 2. These may be: components suitable for surface mounting, the so-called SMDs such as PLCCs, QFPs, SOTs, etc., or components having connection wires which are to be inserted in holes in the printed circuit board 2. The components must be placed on the printed circuit board 2 in an accurate manner with small mutual interspacings. The components to be placed are packed in known manner in packaging tapes 9 wound on reels 7. The packaging tape 9 comprises a carrier tape 11 with compartments and a covering tape 13. The covering tape 13 is removed from the carrier tape 11 and the components accommodated in the compartments may be taken from the carrier tape 11 in a feed position 15. The components are taken from the feed positions 15 and put on the printed circuit board 2 by a transfer mechanism 17. The transfer mechanism 17 comprises a slide 19 which can be displaced in the x-directions and a pick-up device 21 which is also constructed as a slide and which can be displaced in the y-directions. The pick-up device 21 is provided with a number of manipulators 23 which are capable of picking up components by means of an underpressure and which are each rotatable about a z-axis which is transverse to the x- and y-directions. A more detailed description of such a device 1 which is suitable for placing components on a printed circuit board 2 can be found in European Patent 92292. The manipulators 23 are positioned in the pick-up device 21 in a pattern which corresponds to the pattern of the feed positions 15, so that the manipulators 23 can pick up components simultaneously. The device further comprises an imaging device 25 which is situated between the feed positions 15 and the printed circuit board 2. The imaging device comprises a known video camera (not shown), a flash gun (not shown) and an optical system (not shown). Pictures can be taken by the camera 25 of objects which are present in the image field 27 situated above the camera.

Figure 3:
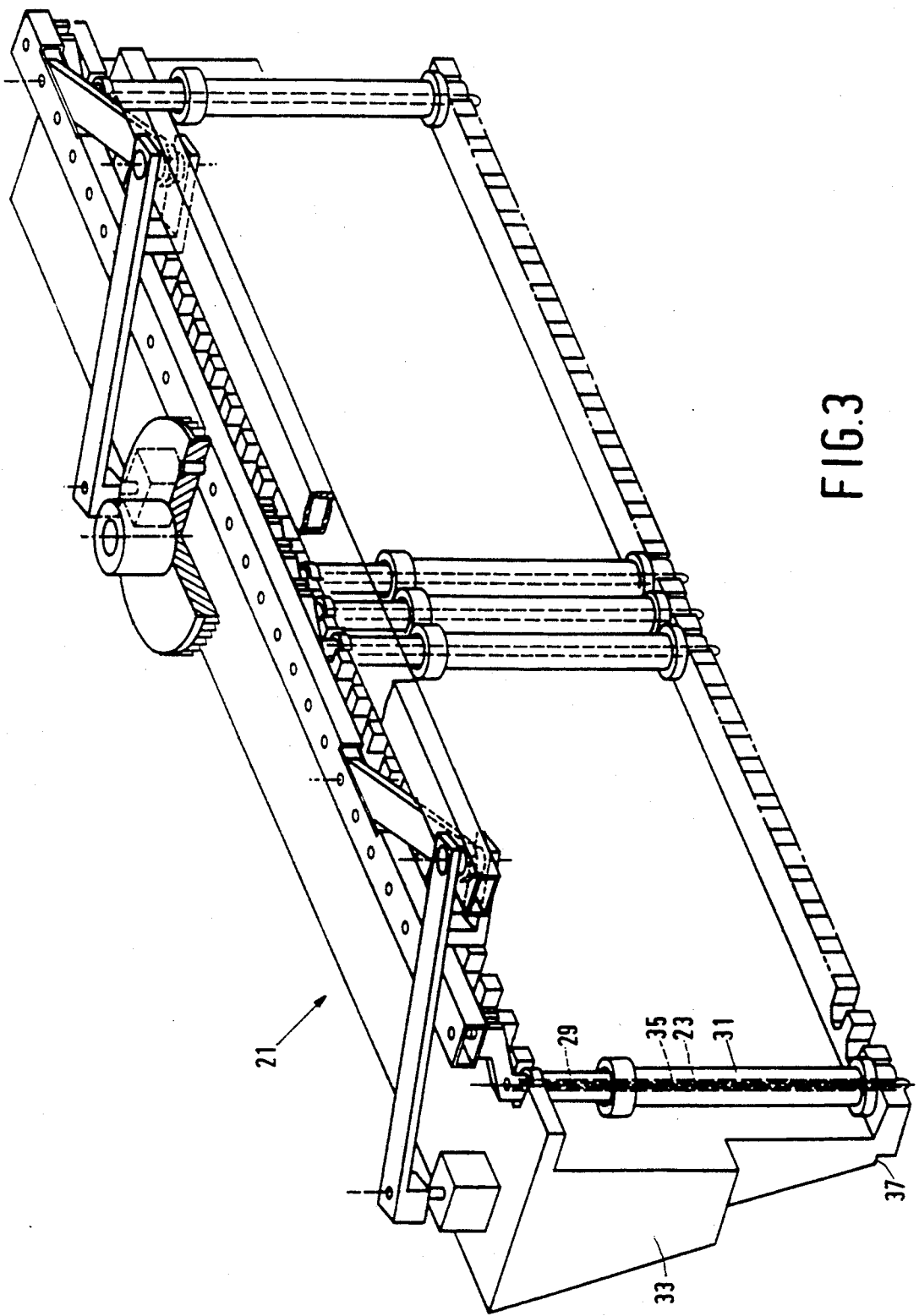
FIG. 3 shows a pick-up device with a number of manipulators of the device.
Figure 4:
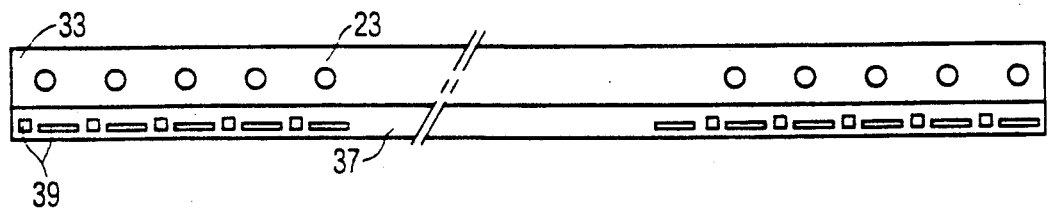
FIG. 4 is a bottom view of the pick-up device depicted in FIG. 3.

FIG. 3 shows a pick-up device which corresponds to a device as described in detail in a European Patent Application by Applicant, Publication EP-A10434156 (Application No. 90203353.9). Each cylindrical manipulator 23 is rotatable about a centerline 29 and arranged coaxially in a holder 31 which is connected to a frame 33. Each manipulator 23 is provided with a coaxially situated channel 35 in which an underpressure can be generated, so that the manipulator 23 can pick up a component. The pick-up device 21 is further provided with a reference member 37. The reference member 37 has notch provided in a frame 33 of the pick-up device 21, which notch is essentially black and on which white marks 39 are provided (see FIG. 4). The positions of the marks 39 relative to the manipulators 23 are measured and stored in a control system (not shown).

The operation of the device 1 is now briefly explained. The transfer mechanism 17 with the manipulators 23 is brought to above the feed positions 15 by the control system (not shown) for the device 1. Components are picked up simultaneously or one by one by the manipulators 23 by means of an underpressure. The manipulators 23 are then displaced in a y-direction through the image field 27 over the camera 25. The moment a manipulator 23 has present in the image field 27 of the camera 25 the flash gun is triggered and a picture of the component held by the manipulator and of a portion of the reference member 37 situated in the vicinity of the manipulator is taken. The movements of the transfer mechanism 17 and the manipulators 23, the camera 25 and the flash gun are controlled by the control system. A picture is taken of every component in this manner. A picture may be obtained of each component carried by a manipulator 23 and a portion of the reference member 37 in a short time since the pictures of the components are taken while the manipulators 23 are moving over the camera 25, without each manipulator 23 having to be stopped in the image field 27 of a imaging device 25. Deceleration and acceleration forces on the components are avoided by this, and displacements of the component relative to the manipulator 23 as a result of these forces are prevented.

The reference member 37 may also be constructed as a plate which is fastened to the frame 33 and which is provided with marks against a contrasting background, which plate is directed transversely to the centerlines 29 of the manipulators 23.

Figure 5:
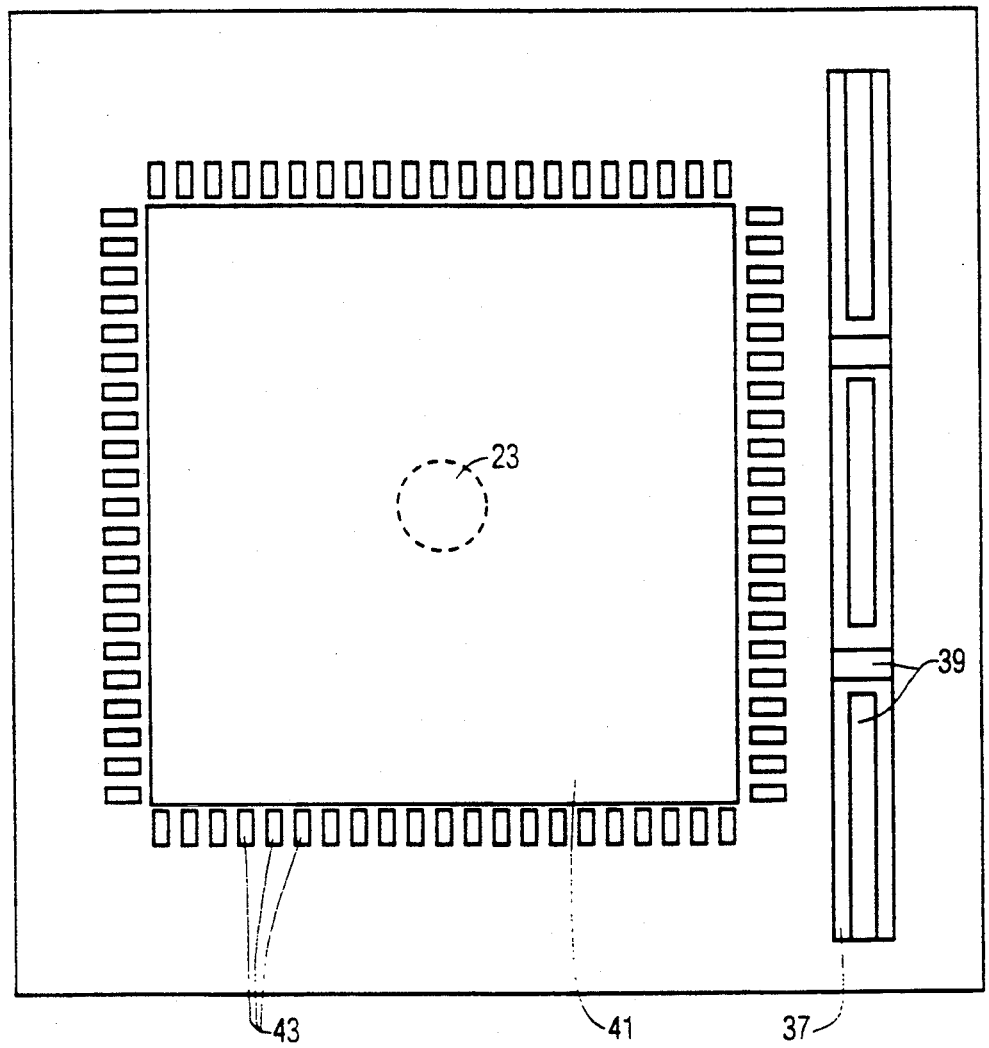
FIG. 5 shows a component with a reference member according to the invention, FIG. 6a diagrammatically shows a second embodiment of a device according to the invention.

FIG. 5 shows a diagrammatic picture of a component 41 and a portion of the reference member 37 fastened to the frame 33. The connection surfaces 43 of the component 41 and the marks 39 of the reference member 37 are clearly visible. The control system stores where the camera 25 is situated relative to the device 1, where the reference member 37 is situated relative to the manipulator 23, as well as a model picture of the connection surfaces 43 of the component 41. The position of the reference member 37 relative to the camera 25 at the moment at which the picture was made can be determined from the picture made, after which the position of the manipulator 23 can also be determined. The position of the component 41 relative to the camera 25 at the moment at which the picture was made can also be derived from this picture. When the positions of the manipulator 23 relative to the camera 25 and of the component 41 relative to the camera 25 are known, the position of the component 41 relative to the manipulator 23 is implicitly known as a result. This relative position, however, need not be separately computed. The control system then determines the angular rotation and the displacements to be carried out by the manipulator 23 in such a way that the component 41 is placed on the printed circuit board 2 in the desired position. It should be understood that the term "position" includes both location and orientation information.

Other known imaging devices such as, for example, linear CCD cameras, photocameras, or laser scanners may be used instead of a video camera.

FIG. 6a shows a second embodiment of a device 50 according to the invention which is suitable for placing components 51 with connection wires 53 in holes 55 in a printed circuit board 57. The device corresponds to a device as described in detail in a European Patent Application by Applicant in said Application no. 90203234.1 but without the main feature of the present invention. The device 50 comprises a robot 59 which is provided with a manipulator 61 which can pick up components by means of grippers 63. The manipulator 61 is provided with three legs 65 which act as reference members. The robot 59 is controlled by a control system 67. The control system 67 is provided with information about the movements to be carried out by the robot 59 by a computer 69. The device 50 is further provided with an imaging device 71 (FIGS. 6b, 6c) which comprises seven light sources and seven light sensors. A light beam emitted by each light source is detected by a light sensor cooperating with this light source. The operation of the device 50 is as follows. The component 51 held by the manipulator 61 is moved through the imaging device 71 by the robot 59. The legs 65 of the manipulator 61 interrupt the light beams 101, 102 and 103, so that the light sensors temporarily receive no light. The times at which the light beams are interrupted are stored in the computer. The moments at which the connection wires 53 of the component 51 interrupt the light beams 104, 105 and 106 are also stored in the computer 69. The times at which the connection wires 53 of the component 51 interrupt the light beams 104, 105, and 106 are also stored in the computer 69. The light beam 107 is only interrupted if one of the connection wires 53 is too long, so that the computer 69 gives an alarm signal. The position of the component 51 relative to the manipulator 61 is computed by the computer 69 from the times at which the light beams 101 to 106 were interrupted. This may be done in a manner analogous to that described in the cited European Patent Publication EP-A20432848 (Application 90203234.1) referred to above or the above mentioned U.S. Pat. No. 4,553,843. The position of the printed circuit board 57, the positions of the holes 55 and the expected position of the component 51 relative to the manipulator 61 are stored in each computer 69.

The displacement to be carried out by the manipulator 61 is computed from the position of the manipulator 61 the deviations of the actual position from the expected position of the component 51 relative to the manipulator 61, and the positions of the holes 55 in the printed circuit board 57 in such a way that the connection wires 53 can be inserted in the holes 55 of the printed circuit board, upon which the component 51 is placed on the printed circuit board 57. The position of the printed circuit board 57 relative to the manipulator 61 must be exactly known in order to obtain a correct placement of the component 51. The exact position of the imaging device 71 relative to the manipulator 61 and the printed circuit board 57 need not be known because this position plays no part in the determination of the position of the component 51 relative to the manipulator 61 and the printed circuit board 57.

A picture of the component and of a reference member coupled to the manipulator is used both in the determination of the positions of manipulator and component relative to the imaging device and in the determination of the position of the component relative to the manipulator. Both methods can be used with the devices described above. When determining the positions relative to the imaging device, the position of the imaging device relative to the device must be exactly known.

We claim:

1. A method of placing a component on a printed circuit board comprising displacing a manipulator carrying the component relative to an imaging device having in image field, moving the component into the image field of the imaging device, determining the position of the component with the imaging device, and placing the component into a predetermined position on the printed circuit board by the manipulator, said determining including taking a picture of the component and of a reference member coupled to the manipulator with the imaging device, and then determining the positions of the component and the manipulator relative to the imaging device from the picture.

2. A method as claimed in claim 1 wherein the taking of said picture with the imaging device is performed while the component carried by the manipulator and the reference member coupled to the manipulator are being moved through the image field of the imaging device.

3. A method of placing a component on a printed circuit board comprising displacing a manipulator carrying the component relative to an imaging device having an image field, bringing the component into the image field of the imaging device, determining the position of the component with the imaging device and placing the component into a predetermined position on the printed circuit board with the manipulator, said determining including making a picture of the component and of a reference member coupled to the manipulator with the imaging device and determining the position of the component relative to the manipulator from the picture.

4. The method of claim 3 wherein the making of said picture is performed while the component carried by the manipulator and the reference member coupled to the manipulator are being moved through the image field of the imaging device.

5. A method of determining the position of a component comprising:
   moving a component into the image field of an imaging device;
   creating an image of the component and a reference member, said member manifesting the position of said component relative to said imaging device during said moving; and
   determining the position of the component relative to the imaging device in response to the created image of said component and said reference member.

6. The method of claim 5 including placing the component in a predetermined position after said determining.

7. A component manipulator device for placing a component on a printed circuit board comprising:
   imaging means having an image field;
   at least one component manipulator operatively associated with said imaging means;
   a reference member coupled to said at least one manipulator and having a fixed position relative to said manipulator;
   means operatively associated with said reference member and said manipulator to move a component secured thereto and said reference member into said image field; and
   means for determining the position of the component relative to said imaging means and for causing the manipulator to place the component into a predetermined position on said printed circuit board;
   said means for determining including means for creating an image of said component and said reference member and means responsive to said created image for determining the position of the component and the manipulator relative to the imaging means.

8. A device as claimed in claim 7 including a plurality of manipulators, said reference member being coupled to all of said manipulators.

9. A device as claimed in claim 7 wherein the reference member comprises a plate having at least one mark.

10. A device as claimed in claim 7 wherein the reference member comprises a plurality of legs.

11. A device for displacing a component to a predetermined location comprising:
   means for moving a component into the image field of an imaging device;
   means including the imaging device for creating an image of the component and a reference member manifesting the relative position of said component to said imaging device during said moving; and
   means responsive to the created image of said component and said reference member for determining the position of the component relative to said imaging means, said means being operatively associated one to the other.

12. A device for placing a component in a predetermined location comprising:
   means for moving a component and a reference member into the image field of an imaging device, said reference member manifesting the relative position of the component thereto;
   means including the imaging device for creating an image of the component and the reference member, said image manifesting the relative position and orientation of said component to the imaging device during said moving;
   means for determining the position and orientation of the component in response to the created image of said component and said reference member; and
   means responsive to said means for determining for placing the component in said predetermined location in a given component orientation.

* * * * *